(12) United States Patent
Eakins et al.

(10) Patent No.: US 7,097,494 B1
(45) Date of Patent: Aug. 29, 2006

(54) ALIGNMENT PLATE

(75) Inventors: Bert Eakins, Ortonville, MI (US); Camilla Sienkiewicz, Harrison Township, MI (US)

(73) Assignee: Lear Corporation, Southfield, MI (US)

(*) Notice: Subject to any disclaimer, the term of this patent is extended or adjusted under 35 U.S.C. 154(b) by 0 days.

(21) Appl. No.: 10/906,240

(22) Filed: Feb. 10, 2005

(51) Int. Cl.
*H01R 13/58* (2006.01)
(52) U.S. Cl. .................................... 439/475
(58) Field of Classification Search ........... 439/163, 439/475, 76.1, 76.2, 949, 929
See application file for complete search history.

(56) References Cited

U.S. PATENT DOCUMENTS 5,777,850 A * 7/1998 Jakob et al. ............... 439/76.2
5,921,789 A * 7/1999 Makino et al. ............... 439/79

FOREIGN PATENT DOCUMENTS

EP    0 810 697 A3    5/1998

* cited by examiner

*Primary Examiner*—Briggitte R. Hammond
(74) *Attorney, Agent, or Firm*—Brooks Kushman P.C.

(57) ABSTRACT

A method and system relate to use of an alignment plate in electrical assemblies having terminal blades or other features. The alignment plate includes features for suspending the plate relative to the terminal blades for protecting the blades during assembly, transport, and other operations.

9 Claims, 4 Drawing Sheets

ALIGNMENT PLATE

BACKGROUND OF THE INVENTION

1. Field of the Invention

The present invention relates to assemblies having a printed circuit board (PCB) or other feature with terminal blades to which a connector is connected.

2. Background Art

Junction boxes and other electrical assemblies typically include a housing and a printed circuit board (PCB) or other electrically conducting unit stored therein. A connector or other feature may be received within an opening of the housing to connect to the PCB. The connector may connect to any number of features of the PCB, including terminal blades projecting from a topside of the PCB.

The terminal blades typically connect to terminals of the connector. In some cases, the positioning of the terminals relative to the terminal blades is dependent upon positioning of the connector within the opening of the housing. The opening is typically proximate the terminal blades and includes raised side walls to assist in receiving and positioning the connector.

Once positioned within the opening, the connector may be moved in a downward direction to electrically connect the terminals therein to the terminal blades on the PCB. In some situations, the junction box may be assembled separately from the connector whereby the connector is subsequently positioned within the opening of the housing in an assembly process. Accordingly, the junction box may be transferred separately from the connector for subsequent assembly therewith. During this period, the terminal blades may be exposed through the opening of the housing.

In order to easily assembly the connector, the connector should align with the terminals blades within a predefined tolerance range. The exposure of the terminal blades prior to connector assembly can cause the blades to shift or otherwise exceed this tolerance range.

SUMMARY OF THE INVENTION

One non-limiting aspect of the present invention relates to an alignment plate for use in conjunction with a junction box or other feature having exposed terminal blades to guard against misalignment of the terminal blades with a connector.

One non-limiting aspect of the present invention relates to an alignment plate for use in conjunction with a junction box or other feature having exposed terminal blades to protect the terminal blades during transportation.

In accordance with one non-limiting aspect of the present invention, an alignment plate is provided for use in an electrical system having an electrically conducting unit with a number of terminal blades projecting from a topside therefrom, a housing having an opening with raised side walls proximate the terminal blades, and a connector configured for positioning within the opening and connecting terminals included therein to one or more of the terminal blades.

In accordance with one non-limiting aspect of the present invention, the alignment plate may include at least one feature operable with one or more of the raised side walls to suspend the plate in an offset position relative to the terminal blades yet insufficient to retain the suspended plate in the offset position if the connector is inserted into the opening. In this manner, the inserted connector may be used to move the suspended plate from the offset position to a lowered position.

In accordance with one non-limiting aspect of the present invention, the alignment plate may lack any elements which catch on the connector to return the plate from the lowered position to the offset position with removal of the connector from the opening.

In accordance with one non-limiting aspect of the present invention, the feature used to suspend the alignment plate may be a tab. The tab may be part of the alignment plate that cooperates with features on the raised side walls to suspend the plate and which bend, flex or otherwise permit the plate to move past the features on the raised side walls so as to permit the plate to move from the suspended position to the lowered position.

In accordance with one non-limiting aspect of the present invention, the feature used to suspend the alignment plate may be a breakaway tab. The breakaway tab may be an integrated molding features used to permit molding material to flow between the side walls and the alignment plate during a molding operation. The breakaway tabs may be sufficiently sized to breakaway from the raise side walls upon insertion of the connector in order to permit the connector to move the plate from the suspended position to the lowered position.

In accordance with one non-limiting aspect of the present invention the alignment plate may include one or more openings associated with one or more of the terminal blades. In this manner, the opening may be used to permit one or more terminal blades to protrude through a topside of the plate if the plate is in the lowered position.

One aspect of the present invention relates to a housing for use with an electrically conducting unit having a number of terminal blades projecting from a topside therefrom and a connector configured for connecting terminals included therein to one or more of the terminal blades.

In accordance with one non-limiting aspect of the present invention, the housing may include an opening with raised side walls proximate the terminal blades and a plate configured to fit within the side walls. The plate may include a breakaway feature for securing it to at least a portion of the side walls in an offset position relative to the conducting unit. In this manner, the breakaway feature may disconnect from the side wall if the connector is inserted into the opening so as to permit the connector to move the suspended plate from the offset position to a lowered position.

In accordance with one non-limiting aspect of the present invention, the housing and plate may be formed in a molding operation wherein the breakaway feature corresponds with at least one mold gate through which molding material flows to form the plate. The housing and plate may be formed in a single molding operation.

In accordance with one non-limiting aspect of the present invention, the plate may include openings through which the terminals may protrude and include a selectable suspension position of the breakaway features. For example, the breakaway features may be offset from the terminal blades a distance sufficient to permit at least one or more of the terminal blades to extend though one of the openings to a topside of the plate when the plate is in the offset position and/or the breakaway features may be offset from the terminal blades a distance sufficient to prevent at least one or more of the terminal blades from extending though one of the openings to a topside of the plate when the plate is in the offset position.

One non-limiting aspect of the present invention relates to a method of protecting terminal blades of an printed circuit board (PCB). The method may include configuring a housing having an opening defined by raised side walls for receiving a connector having features for connecting terminals included therein to one or more of the terminal blades. The method may further include configuring a plate to fit within the side walls and to include a breakaway feature for securing the plate to at least a portion of the side walls in an offset position relative to the PCB. The breakaway feature may be configured to disconnect from the side wall if the connector is inserted into the opening to move the suspended plate from the offset position to a lowered position.

The above features and advantages, along with other features and advantages of the present invention, are readily apparent from the following detailed description of the invention when taken in connection with the accompanying drawings.

DETAILED DESCRIPTION OF THE PREFERRED EMBODIMENT(S)

Figure 1:
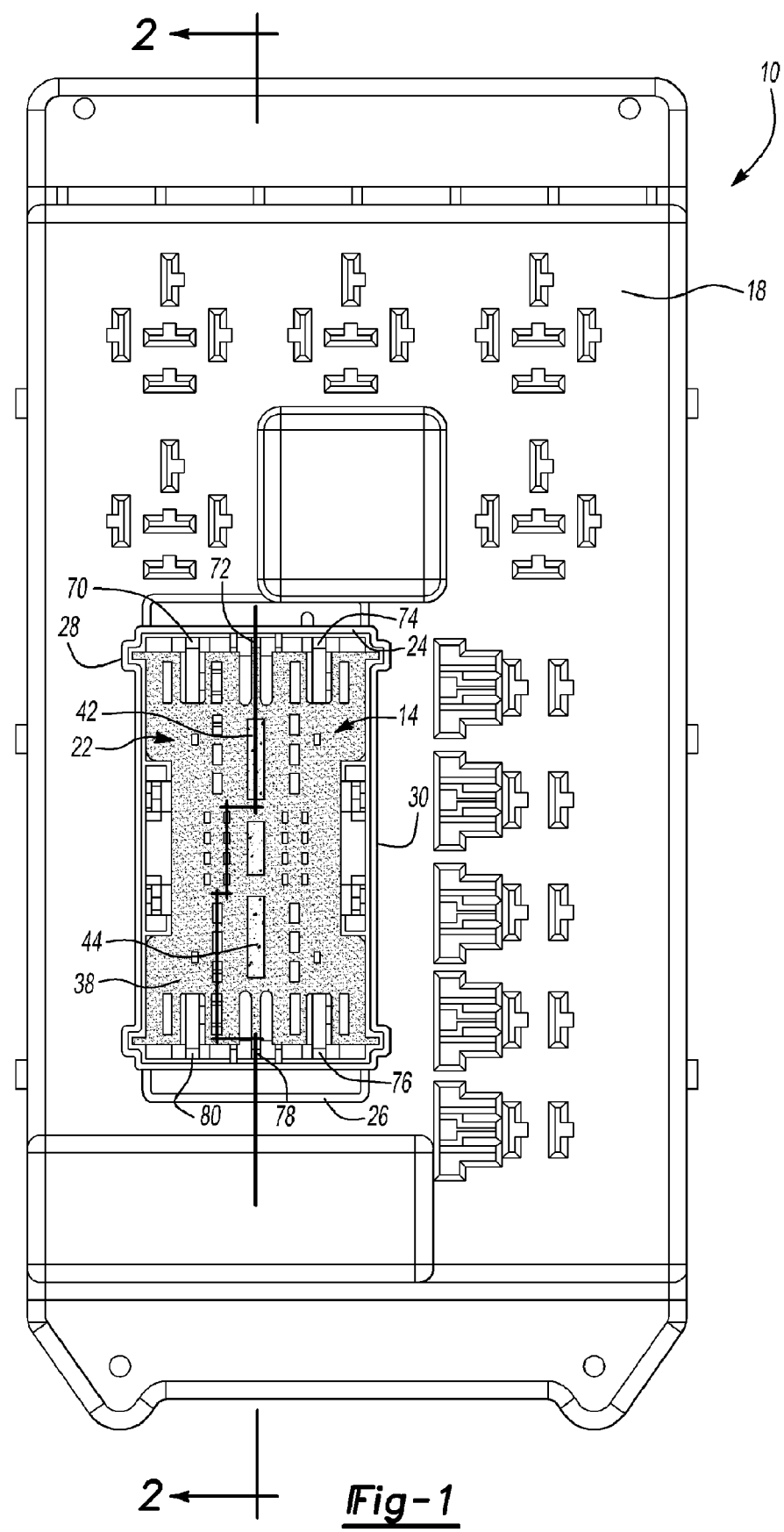
FIG. 1 illustrates a topside view of a junction box in accordance with one non-limiting aspect of the present invention.

FIG. 1 illustrates a topside view of a junction box 10 in accordance with one non-limiting aspect of the present invention. The junction box 10 includes a number of terminal blades 14 for electrically connecting to connector terminals of a connector (not shown). The junction box 10 includes a housing 18 having an opening 22 for receiving the connector.

Figure 2:
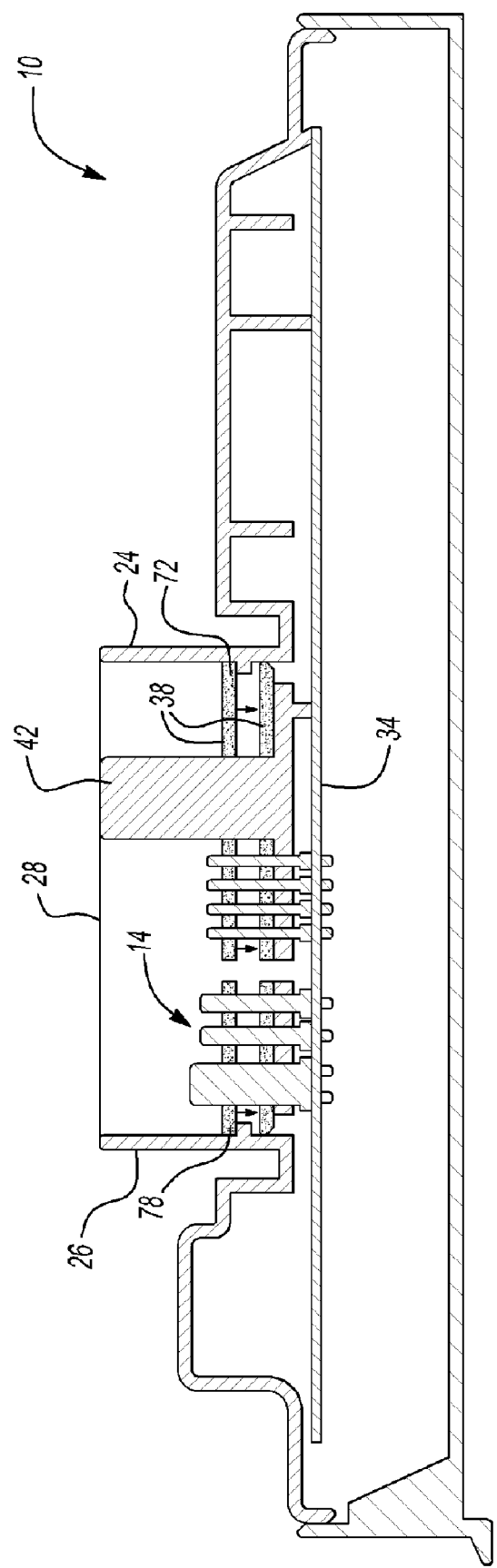
FIG. 2 illustrates a cross-sectional view of the junction box in accordance with one non-limiting aspect of the present invention.

FIG. 2 illustrates a cross-sectional view of the junction box 10 in accordance with one non-limiting aspect of the present invention. As shown, the opening includes raised side walls 24–30 for receiving and positioning the connector relative to the terminals blades 14. In accordance with one non-limiting aspect of the present invention, the terminal blades 14 extend from a printed circuit board (PCB) 34 for electrically connecting the connector terminals to the PCB 34.

The junction box 10 shown in FIGS. 1 and 2 is provided for exemplary purposes and is not intended to limit the scope and contemplation of the present invention. Rather, the present invention contemplates any number of configurations and features for the junction box 10, connector, PCB 34, and terminal blades 14. In particular, the present invention contemplates the use of electrically conducting assemblies beside junction boxes, including terminals, fuse boxes, and the like.

In accordance with one non-limiting aspect of the present invention, an alignment plate 38 may be included with the junction box 10. The alignment plate 38 may be configured to be suspended within the opening 22 to protect and/or secure alignment of the terminal blades 14 during transport, such as prior insertion of the connector.

In accordance with one non-limiting aspect of the present invention, the alignment plate 38 may be moved downwardly from a suspended position by movement of the connector. In more detail, the connector may be inserted into the opening and moved downwardly in the direction of the arrows to permit the connector terminals to connect with the terminals blades 14, thereby establishing electrical communication therebetween. In this manner, the junction box 10 and connector may be separately shipped to an assembly center for assembly whereby the terminal blades 14 are protected during shipping with the alignment plate 38.

Of course, the present invention is not intended to be limited to any particular method of inserting the alignment plate 38. In particular, the movement of the connector may be provided by simply pressing down on the topside of the connector and/or the alignment plate 38 (i.e., prior to insertion of the connector). In addition, other mechanisms and features may be included to facilitate the movement of the connector and/or alignment plate 38, such as a cam included on the connector which cooperates with features on the raised side walls 24–30 to move the connector downwardly with movement of a cam handle once the connector is positioned partially within the opening 22.

In addition to the alignment plate 38, the present invention contemplates any number of other features to facilitate inserting and connecting the connector to the terminal blades 14, including alignment tabs 42–44 and/or other features (not shown) associated with the side walls. In particular, the alignment tabs 42–44 may be integrated into the PCB 34 to facilitate centering or otherwise positioning the connector relative to the opening 22 and terminal blades 14.

Figure 3:
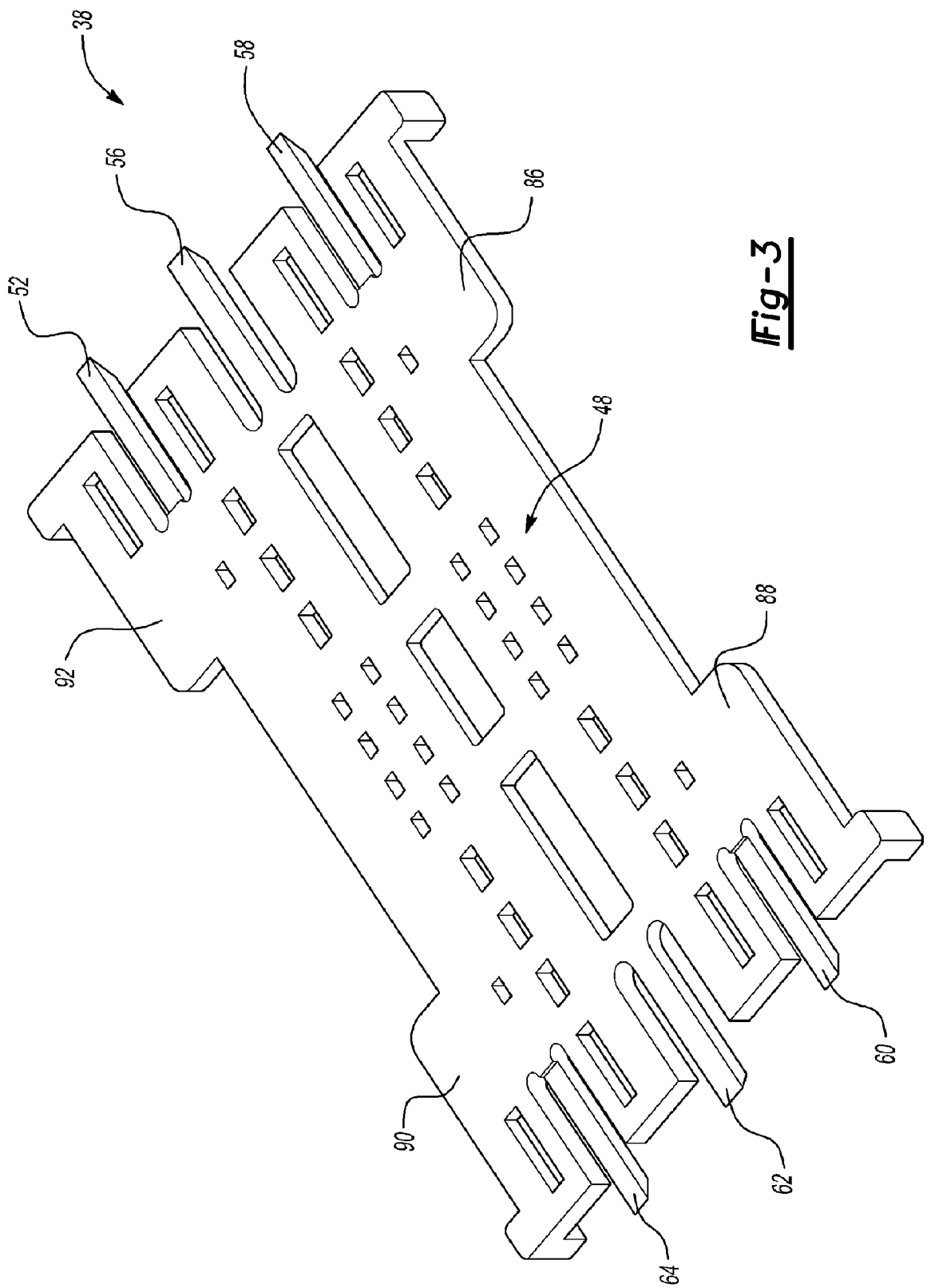
FIG. 3 illustrates an alignment plate in accordance with one non-limiting aspect of the present invention.

FIG. 3 illustrates the alignment plate 38 in accordance with one non-limiting aspect of the present invention. As shown, the alignment plate 38 includes a number of openings 48 through which the terminal blades 14 and alignment tabs 42–44 may protrude. In addition, the alignment plate 38 includes a number of tabs configured to cooperate with tabs (see FIG. 2) on the raised side walls 24–30 to suspend the alignment plate within the opening 22.

Upon insertion and downward movement of the connector, and in accordance with one non-limiting aspect of the present invention, the tabs 52–64 flex, break, or otherwise move passed to the side wall features 70–80 to permit the connector to move to a position proximate the PCB 34, as shown in FIG. 2. In this manner, the tabs 52–64 permit the alignment plate to protect the terminal blades 14 during transport and prior to insertion of the connector while permitting insertion of the connector without removal of the alignment plate 38.

In accordance with one non-limiting aspect of the present invention, the dimensioning and position of the tabs 52–64 and side wall features 70–80 may be selectable to facilitate positioning of the alignment plate 38 within the opening 22. In particular, the dimensioning may be selected such that the alignment plate 38 is offset from the PCB 34 such that one or more of the terminals 14 extend through the alignment plate openings 48 when suspended, such as to permit testing of the PCB 34 when the alignment plate 38 is in place. Likewise, the dimensioning may be selected such that the alignment plate 38 is sufficiently offset form the PCB 34 to prevent the terminal blades 14, and optionally the alignment tabs 42–44, from projecting through the alignment plate openings 48 when suspended.

The dimensioning of the tabs 52–64 and side wall features 70–80 in this manner may be advantageous depending on design and assembly parameters. Of course, the present invention contemplates other dimensioning and configurations, including selecting a thickness of the alignment plate 38 and its offset from the PCB 34 when suspended such that one or more of the terminal blades 14 may extend within the alignment plate 38 but not through the topside so as to secure their positioning without exposing the blades 14.

In accordance with one non-limiting aspect of the present invention, a shape, outline, of other configuration of the alignment plate 38 may be selected to facilitate positioning of the alignment plate 38 within the opening 22. In particular, the alignment plate 38 may include projecting corner portions 86–92 which align within channels of the opening 22 to facilitate orientating the alignment plate 38 within the opening 22 and/or to insure its one-way insertion. This may be advantageous, for example, in cases where the terminal blades 14 are not symmetrically aligned such that the alignment plate 38 must have only one orientation for assembly in order to prevent misalignment of the terminal blades 14 and the alignment plate openings 48.

Figure 4:
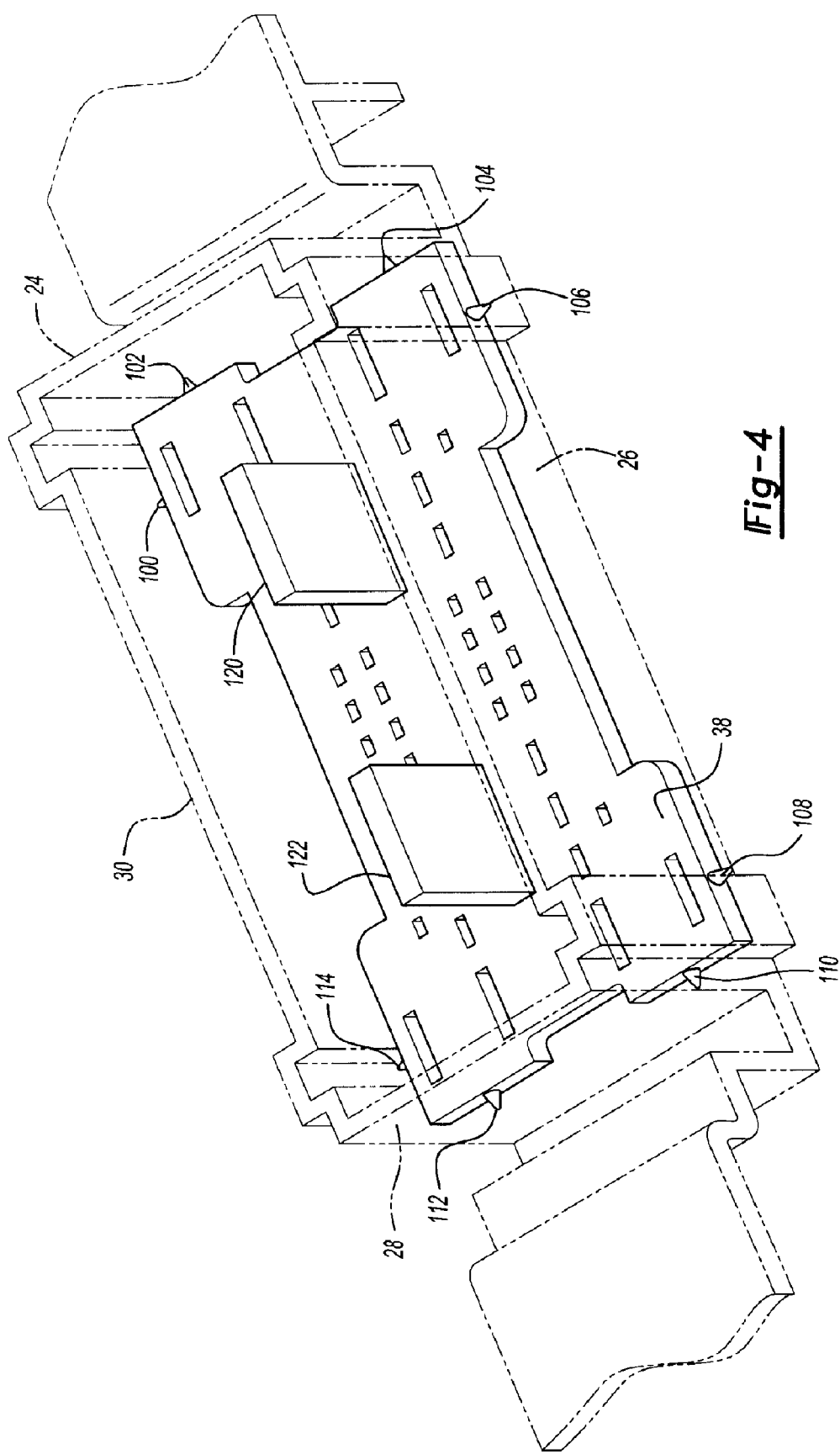
FIG. 4 illustrates an alignment plate in accordance with one non-limiting aspect of the present invention.

FIG. 4 illustrates the alignment plate 38 in accordance with one non-limiting aspect of the present invention. As shown, the alignment plate 38 includes a number of mold gates 100–114 or tie tabs through which the alignment plate 38 may be integrally molded to the raised side walls 24–30 of the housing opening 22 (partial view of the housing is shown in phantom).

The mold gate 100–114 shapes may vary and may be positioned along the periphery of the alignment plate 38 to secure the alignment plate to the side walls 24–30 during and after a molding operation wherein the alignment plate 38 and housing 18 are formed in a common operation, such as in a single shot injection molding process. In this manner, the mold gates 100–114 are preferably sufficient to permit molding material to flow therethrough to form the alignment plate 38 during the molding of the housing 18.

Of course, the present invention contemplates molding the housing 18 in any number of operations and is not intended to be limited to single shot operations. Moreover, the present invention contemplates molding operations wherein the opening portion 22 of the housing 18, including the alignment plate 38, is formed separately from the rest of the housing 18 such that the opening 22 and integrally molded alignment plate 38 together form an insert or other feature which may be subsequently added to or associated with molding the remainder of the housing 18.

The mold gates 100–114 are preferably breakaway features that disconnect form the side walls with downward movement of the connector. In more detail, the dimensioning of the tabs 100–114, i.e., thickness, length, width, etc., are selected to correspond with the molding material and other parameters of the molding operation, size of the alignment plate 38, opening 22, and housing 18, and any number of other features such that a sufficient quantity of breakaway tabs 100–114 are provided to deliver molding material to the alignment plate 38 during molding while also permitting the mold gates 100–114 to be relatively easily to break with downward movement of the connector.

The use of such integrally molded breakaway features 100–114 may be advantageous from a manufacturing and assembly perspective. In particular, the use of the integrally molded or otherwise manufactured opening 22 and alignment plate 38 allows precise orientation of the alignment plate within the opening so as to permit tight tolerance control. Moreover, the integral alignment plate eliminates the need to separately insert the alignment plate 38 within the opening 22 in other manufacturing/assembly steps.

In accordance with one non-limiting aspect of the present invention, the integrally manufacture alignment plate 38 may also eliminate the need for the side wall features 70–80 shown in FIG. 2 which cooperate with the alignment tabs 52–64 shown in FIG. 3 to suspend the alignment plate 38. In accordance with one non-limiting aspect of the present invention, the alignment plate 38 may include connector alignment tabs 120–122, similar to the alignment tabs 42–44 shown in FIG. 2, to facilitate alignment of the connector within the opening 22, thereby eliminating the need to include such features on the PCB 34.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A housing for use with an electrically conducting unit having a number of terminal blades projecting from a topside therefrom, the housing comprising:
   an opening with raised side walls proximate the terminal blades; and
   a plate configured to fit within the side walls and including a breakaway feature for securing the plate to at least a portion of the side walls in an offset position relative to the conducting unit, the breakaway feature disconnecting from the side wall if the connector is inserted into the opening to move the plate from the offset position to a lowered position.

2. The housing of claim 1 wherein the plate includes one or more openings associated with one or more of the terminal blades such that the one or more terminal blades associated with the one or more openings project through a topside of the plate if the plate is in the lowered position.

3. The housing of claim 1 wherein the plate includes one or more connector alignment tabs projecting from a topside thereof.

4. The housing of claim 1 wherein the plate comprises a non-conducting material.

5. The housing of claim 1 wherein the housing and plate are formed in a molding operation and the breakaway feature corresponds with at least one mold gate through which molding material flows to form the plate.

6. The housing of claim 5 wherein the housing and plate are formed in a single molding operation.

7. The housing of claim 1 wherein the plate lacks any elements which to return the plate from the lowered position to the offset position.

8. The housing of claim 7 wherein the breakaway features are offset from the terminal blades a distance sufficient to permit at least one or more of the terminal blades to extend though one of the openings to a topside of the plate when the plate is in the offset position.

9. The housing of claim 7 wherein the breakaway features are offset from the terminal blades a distance sufficient to prevent at least one or more of the terminal blades from extending though one of the openings to a topside of the plate when the plate is in the offset position.

* * * * *

UNITED STATES PATENT AND TRADEMARK OFFICE
CERTIFICATE OF CORRECTION

PATENT NO.        : 7,097,494 B1
APPLICATION NO.   : 10/906240
DATED             : August 29, 2006
INVENTOR(S)       : Bert Eakins and Camilla Sienkiewicz It is certified that error appears in the above-identified patent and that said Letters Patent is hereby corrected as shown below:

Column 6, line 64. Please insert claims 10-16:

10. A method of protecting terminal blades of a printed circuit board (PCB), the method comprising:
configuring a housing for protecting at least a portion of the PCB, wherein the housing includes an opening having raised side walls for receiving a connector, the connector having features for connecting terminals included therein to one or more of the terminal blades;
and configuring a plate to fit within the side walls and to include a breakaway feature for securing the plate to at least a portion of the side wails in an offset position relative to the PCT, the breakaway feature disconnecting from the side wall if the connector is inserted into the opening to move the plate from the offset position to a lowered position.

11. The housing of claim 21 further comprising forming the housing and plate in a molding operation such that the breakaway feature corresponds with at least one mold gate through which molding material flows to form the plate.

12. The housing of claim 22 further comprising forming the housing and plate in a single molding operation.

13. The housing of claim 21 further comprising configuring the plate to include one or more openings associated with one or more of the terminal blades such that the one or more terminal blades associated with the one or more opening project through a topside of the plate if the plate is in the lowered position.

14. The housing of claim 21 further comprising configuring the plate without any element which can catch on the connector to the return plate from the lowered position to the offset position with removal of the connector from the opening.

15. The housing of claim 25 further comprising configuring the breakaway features at a distance sufficient to permit at least one or more of the terminal blades to extend through one of the openings to a topside of the plate when the plate is in the offset position.

UNITED STATES PATENT AND TRADEMARK OFFICE
CERTIFICATE OF CORRECTION

PATENT NO.         : 7,097,494 B1
APPLICATION NO. : 10/906240
DATED              : August 29, 2006
INVENTOR(S)        : Bert Eakins and Camilla Sienkiewicz It is certified that error appears in the above-identified patent and that said Letters Patent is hereby corrected as shown below:

13.     The housing of claim 25 wherein the breakaway features are offset from the terminal blades a distance sufficient to prevent at least one or more of the terminal blades from extending through one of the openings to a topside of the plate when the plate is in the offset position.

Signed and Sealed this

Twenty-eighth Day of November, 2006

JON W. DUDAS
*Director of the United States Patent and Trademark Office*